(12) United States Patent
Singh et al.

(10) Patent No.: US 6,416,933 B1
(45) Date of Patent: Jul. 9, 2002

(54) METHOD TO PRODUCE SMALL SPACE PATTERN USING PLASMA POLYMERIZATION LAYER

(75) Inventors: Bhanwar Singh, Morgan Hill; Bharath Rangarajan, Santa Clara; Wenge Yang, Fremont, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/283,889

(22) Filed: Apr. 1, 1999

(51) Int. Cl.$^7$ .................... G03C 5/00; H01L 21/027
(52) U.S. Cl. .................... 430/313; 438/694; 438/695; 438/696; 438/780
(58) Field of Search .................... 430/313; 438/439, 438/694, 695, 696, 780

(56) References Cited

U.S. PATENT DOCUMENTS

| | | | |
|---|---|---|---|
| 5,580,384 A | | 12/1996 | Thiebaud et al. |
| 5,643,638 A | | 7/1997 | Otto et al. |
| 5,644,153 A | * | 7/1997 | Keller .................... 257/324 |
| 5,654,917 A | | 8/1997 | Ogura et al. |
| 5,667,940 A | | 9/1997 | Hsue et al. |
| 5,968,844 A | * | 10/1999 | Keller .................... 438/695 |
| 6,040,248 A | * | 3/2000 | Chen et al. .................... 438/725 |
| 6,103,596 A | * | 8/2000 | Peng .................... 438/389 |

* cited by examiner

*Primary Examiner*—Shean C. Wu
(74) *Attorney, Agent, or Firm*—Amin & Turocy, LLP

(57) ABSTRACT

The present invention relates to a method for forming an etch mask. A photoresist layer is patterned, wherein $d_1$ is a smallest space dimension of an exposed area of a layer underlying the photoresist layer. A polymer layer is formed to be conformal to the patterned photoresist layer and exposed portions of the underlayer. The polymer layer is etched to form polymer sidewalls, the polymer sidewalls reducing the smallest space dimension of the exposed underlayer area to $d_2$, wherein $d_2 < d_1$.

33 Claims, 7 Drawing Sheets

METHOD TO PRODUCE SMALL SPACE PATTERN USING PLASMA POLYMERIZATION LAYER

TECHNICAL FIELD

The present invention generally relates to semiconductor processing, and in particular to a method for producing small space patterns via employment of a plasma polymerization layer.

BACKGROUND OF THE INVENTION

In the semiconductor industry, there is a continuing trend toward higher device densities. To achieve these high densities there has been and continues to be efforts toward scaling down device dimensions (e.g., at submicron levels) on semiconductor wafers. In order to accomplish such high device packing density, smaller and smaller feature sizes are required. This may include the width and spacing of interconnecting lines, spacing and diameter of contact holes, and the surface geometry such as corners and edges of various features.

The requirement of small features with close spacing between adjacent features requires high resolution photolithographic processes. In general, lithography refers to processes for pattern transfer between various media. It is a technique used for integrated circuit fabrication in which a silicon slice, the wafer, is coated uniformly with a radiation-sensitive film, the resist, and an exposing source (such as optical light, x-rays, or an electron beam) illuminates selected areas of the surface through an intervening master template, the photo mask, for a particular pattern. The lithographic coating is generally a radiation-sensitive coating suitable for receiving a projected image of the subject pattern. Once the image is projected, it is indelibly formed in the coating. The projected image may be either a negative or a positive image of the subject pattern. Exposure of the coating through the photomask causes the image area to become either more or less soluble (depending on the coating) in a particular solvent developer. The more soluble areas are removed in the developing process to leave the pattern image in the coating as less soluble polymer.

The spacing between adjacent lines of an integrated circuit is an important dimension, and ever continuing efforts are made toward reducing such spacing dimension. The wavelength of light used in the photolithographic process along with the lithographic tool set employed in the process generally dictate the spacing dimension. For example, a tool set designed to provide lines and/or spaces at 0.18 $\mu$m does not achieve consistent lines and/or spacing at its minimum range of 0.18 $\mu$m but rather is employed to generate lines and/or spacing above the minimum range (e.g., 0.20 $\mu$m) with fairly consistent results.

In view of the above, it would be desirable for a technique which allows for a particular lithographic tool set to be employed and achieve consistent lines and/or spacing between lines at the minimum range of the tool set and even below the minimum range.

SUMMARY OF THE INVENTION

The present invention relates to a method for employing a photolithographic tool set and achieving substantially consistent spacing dimensions below the minimum range of the tool set. A given photolithographic tool set is employed to pattern a photoresist layer in a desired fashion. The tool set is capable of achieving a smallest spacing dimension between adjacent lines of $d_1$. After the photoresist layer is patterned, a plasma polymerization layer is conformably deposited over the patterned photoresist layer. Thereafter, a directional etch is performed to remove a particular amount of the polymerization layer (preferably a thickness equivalent to the thickness of the polymerization layer residing over a photoresist portion). The directional etch leaves polymer sidewalls along the patterned photoresist portions which result in a reduction in dimension size of exposed areas interposed between adjacent photoresist portions. Thus a spacing dimension size ($d_2$) of exposed areas is substantially less than the spacing dimension size ($d_1$) of exposed areas prior to the depositing the polymerization layer. An etch step is performed to etch layers underlying the photoresist. Adjacent lines etched from one of the underlayers will have a smallest spacing design dimension of $d_2$ as compared to $d_1$. Thus, the present invention provides for achieving spacing dimensions between lines at and below a minimum patterning range for a particular lithographic tool set.

One aspect of the invention relates to a method for forming an etch mask. A photoresist layer is patterned, wherein $d_1$ is a smallest space dimension of an exposed area of a layer underlying the photoresist layer. A polymer layer is formed to be conformal to the patterned photoresist layer and exposed portions of the underlayer. The polymer layer is etched to form polymer sidewalls, the polymer sidewalls reducing the smallest space dimension of the exposed underlayer area to $d_2$, wherein $d_2<d_1$.

Another aspect of the invention relates to a method for producing a small space pattern in a semiconductor layer. A photoresist layer of a semiconductor structure is patterned with a photolithographic tool set, a minimum printed space dimension of the patterned photoresist being $d_1$, wherein $d_1$ is the smallest space dimension consistently printable by the photolithographic tool set. A polymer layer is formed to be conformal to the patterned photoresist layer and exposed portions of a first layer underlying the photoresist layer, $d_1$ being the smallest dimension of the exposed portions. The polymer layer is etched an amount substantially equivalent to a minimum thickness parameter ($\gamma$) of the polymer to leave polymer sidewalls such that the smallest dimension of the exposed portions is now $d_2$, wherein $d_2<d_1$.

Another aspect of the invention relates to method of forming closely spaced lines from a polysilicon layer. A semiconductor structure is used, the semiconductor structure including: the polysilicon layer; an anti-reflective coating (ARC) layer over the polysilicon layer; and a patterned photoresist layer over the ARC layer, wherein a smallest dimension of at least one exposed portion of the ARC layer equals $d_1$. A polymer layer is formed to conform to an exposed surface of the semiconductor structure. The polymer layer is etched so as to leave polymer portions along sidewalls of the photoresist layer, the polymer portions reducing the smallest dimension of the at least one exposed portion of the ARC layer to $d_2$, wherein $d_2<d_1$.

Still another aspect of the invention relates to a method of forming closely spaced lines from a polysilicon layer. A photolithographic tool set is used to pattern a photoresist layer of a semiconductor structure wherein $d_1$ is a smallest space dimension consistently printable by the photolithographic tool set, the semiconductor structure including: the polysilicon layer; an anti-reflective coating (ARC) layer over the polysilicon layer; and the patterned photoresist layer over the ARC layer, wherein a smallest dimension of at least one exposed portion of the ARC layer equals $d_1$. The ARC layer is etched. The photoresist layer is removed. A polymer layer is formed to conform to remaining portions of the ARC layer and exposed portions of a polysilicon layer underlying the ARC layer. The polymer layer is etched so as to leave polymer sidewalls, the polymer sidewalls reducing the smallest dimension of the at least one exposed portion of the polysilicon layer to $d_2$, wherein $d_2 < d_1$. The polysilicon layer is etched, wherein a smallest space dimension between at least two adjacent lines is substantially equal to $d_2$.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention will now be described with reference to the drawings.

Figure 1A:
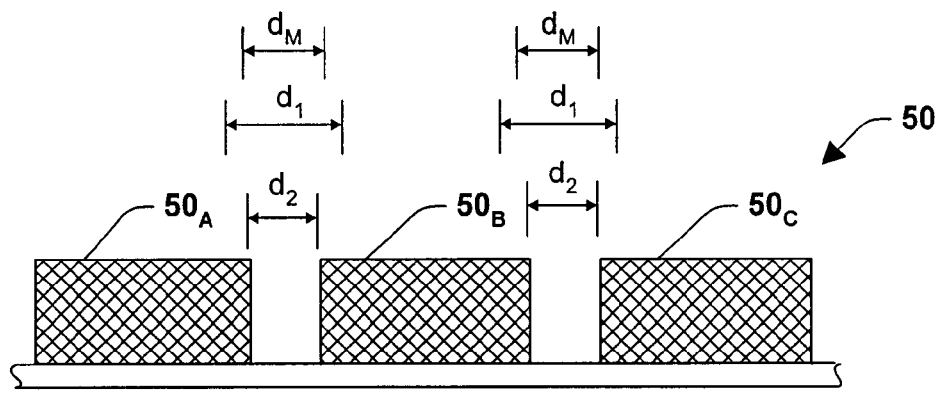
FIG. 1a is a schematic cross-sectional illustration of lines formed in accordance with the present invention.

FIG. 1a illustrates a set of lines $50_A$, $50_B$ and $50_C$ (collectively referred to by reference numeral 50) formed in accordance with the present invention. The lines 50 are formed employing a photolithographic tool set (not shown) having a minimum feature printing dimension of $d_M$. More particularly, the smallest spacing between lines printable by the tool set has a dimension of $d_M$. However, consistent printing at the minimum spacing dimension $d_M$ is typically not possible. The tool set is capable of printing consistently at a spacing dimension of $d_1$ (which is larger than $d_M$). As can be seen from FIG. 1, the present invention provides for employing the particular tool set to form the lines 50 such that a spacing dimension ($d_2$) between adjacent lines, respectively, is achieved. The dimension $d_2$ is substantially less than dimensions $d_M$ and $d_1$.

Figure 1B:
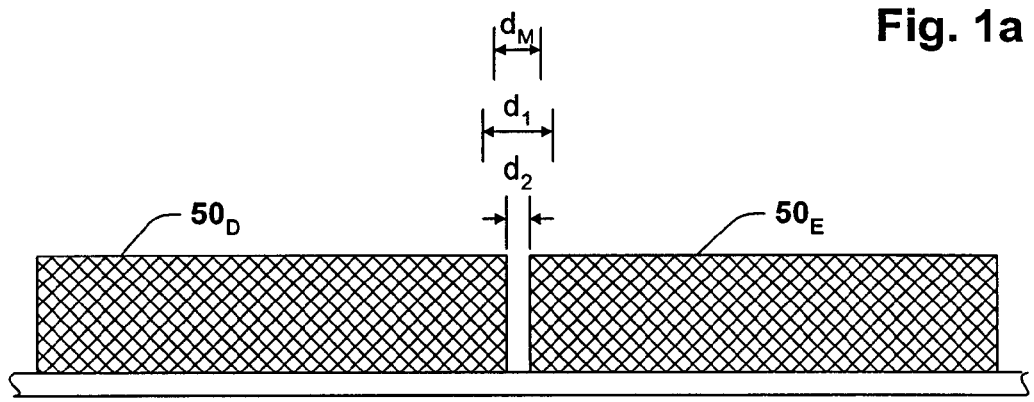
FIG. 1b is a schematic cross-sectional illustration of a ratio of line width to space width in accordance with the present invention.

FIG. 1b illustrates a ratio of line width to space width in accordance with the present invention. As is known, small spacing between adjacent lines having relatively large width is very difficult to achieve. The present invention provides for achieving a ratio of line width to space width of up to about 20:1. Lines $50_D$ and $50_E$ have widths, respectively, about twenty times greater than the space between the lines $50_D$ and $50_E$.

FIGS. 2–11 illustrate in greater detail how the present invention provides for forming the lines 50 having a spacing dimension there between, respectively, of $d_2$ using the tool set which has a minimum print feature dimension of $d_M$ (which is substantially greater than $d_2$).

Figure 2:
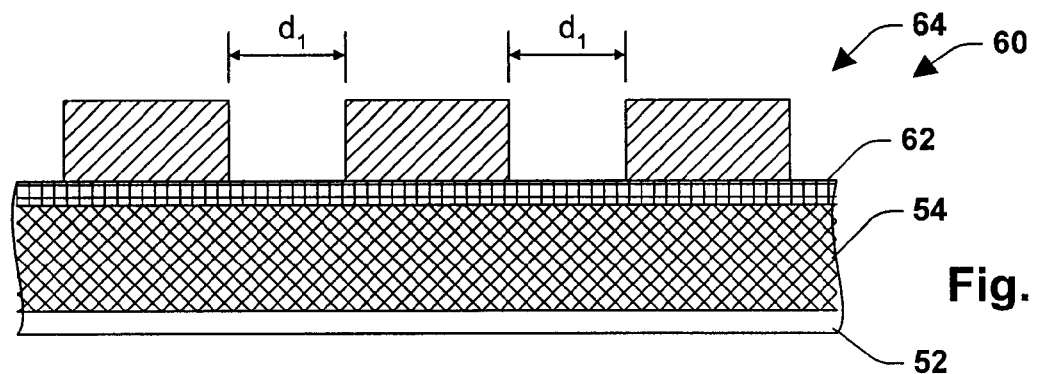
FIG. 2 is schematic cross-sectional illustration of a semiconductor structure including a polysilicon layer, an anti-reflective coating layer and a photoresist layer patterned with a particular tool set.

FIG. 2 illustrates a structure 60 which includes an oxide layer 52, a polysilicon layer 54, an anti-reflective coating layer 62 and a patterned photoresist layer 64. Formation of the structure 60 is well known in the art, and further detail regarding such is omitted for sake of brevity. The photoresist layer 64 has been patterned via a photolithographic tool set (e.g., deep ultra-violet (DUV)) tool set capable of patterning lines separated by distances equal to or greater than 0.18 $\mu$m). The patterned photoresist layer 64 will serve as a mask for the underlying layers during etch steps to form the lines 50. The distance $d_1$ is representative of the smallest space parameter consistently achievable by the photolithographic tool set.

Figure 3:
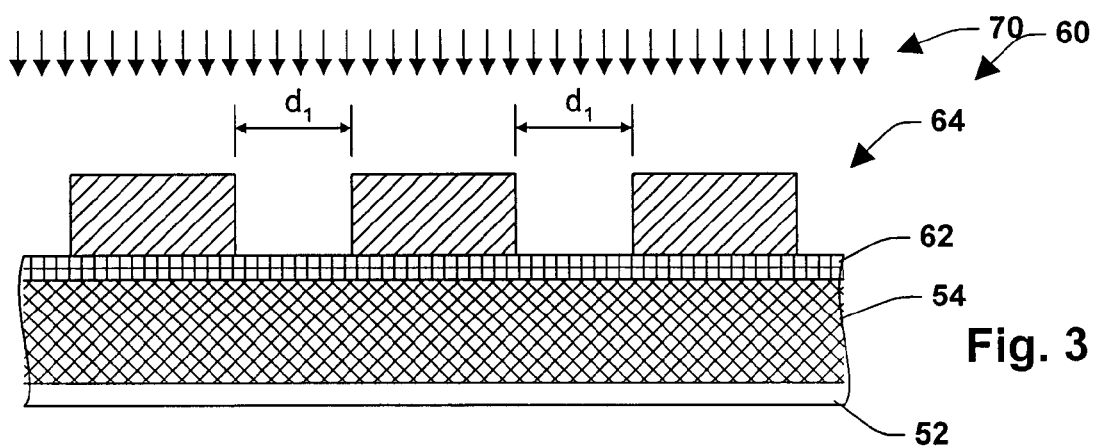
FIG. 3 is a schematic illustration of the semiconductor structure of FIG. 2 undergoing a deposition process to conformably deposit a polymer layer on the structure in accordance with the present invention.

FIG. 3 illustrates a polymer deposition step 70 performed on the structure 60 to form a carbon/oxygen based polymer conformal to the exposed surface of the structure 60. More particularly, the patterned photoresist layer 64 is exposed to at least one of a $CHF_3$ chemistry, an HBr chemistry, a $CH_3F$ chemistry, and a $CH_2F_2$ chemistry to form a conformal polymer coating 80 (FIG. 4) on the patterned photoresist 64. Oxygen based reactive gases are reduced as compared to a typical etch chemistry so that the conformal polymer coating 80 is formed over the photoresist layer 64.

One specific example of a suitable chemistry to form the polymer layer 80 includes using a relatively high pressure of 50–100 mT, relatively low power of less than or equal to 500 W, and a temperature of below 80° C. It is to be appreciated that one skilled in the art could readily tailor without undue experimentation a suitable chemistry to form the conformal polymer coating 80. As discussed in greater detail below, the etch chemistry and duration thereof may be suitably tailored to form the polymer coating at substantially any desired thickness (e.g., between about the range of 10–1000 Å).

Below are some specific examples of chemistries that may be employed in forming the polymer layer 80.

EXAMPLE 1

A MERIE method is used with $CHF_3$ (50 to 200 sccm) with reactant gases of: Ar (100 to 500 sccm) and $O_2$ (10 to 50 sccm) at a power level within the range of about 100 to 500 W and pressure within the range of about 60 to 100 mT.

EXAMPLE 2

A MERIE method is used with HBr (100 to 250 sccm) with reactant gases of: Ar (100 to 500 sccm) at a power level within the range of about 100 to 500 W, and pressure within the range of about 500 to 100 mT.

EXAMPLE 3

A MERIE method is used with $CH_3F$ (50 to 250 sccm) with reactant gases of: Ar (50 to 200 sccm) and $N_2$ (10 to 50 sccm) at a power level within the range of about 100 to 500 W, and pressure within the range of about 50 to 100 mT.

EXAMPLE 4

A MERIE method is used with $CH_2F_2$ (100 to 200 sccm) with reactant gases of: Ar (50 to 200 sccm) and $N_2$ (10 to 50 sccm) at a power level within the range of about 100 to 500 W, and pressure within the range of about 50 to 100 mT.

Figure 4:
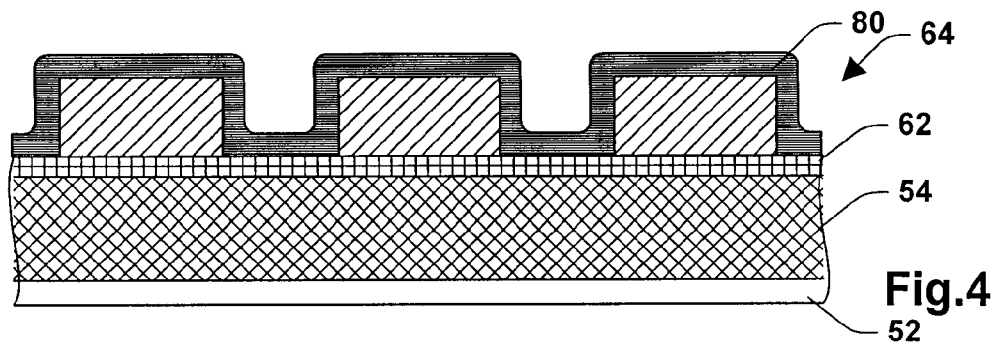
FIG. 4 is a schematic cross-sectional illustration of the structure of FIG. 3 after the polymer layer has been conformably formed on the structure.

FIG. 4 illustrates the structure 60 after the polymer deposition step 70 is substantially complete. The polymer layer 80 is conformal to the exposed surface of the structure 60 with a substantially uniform thickness.

Figure 5:
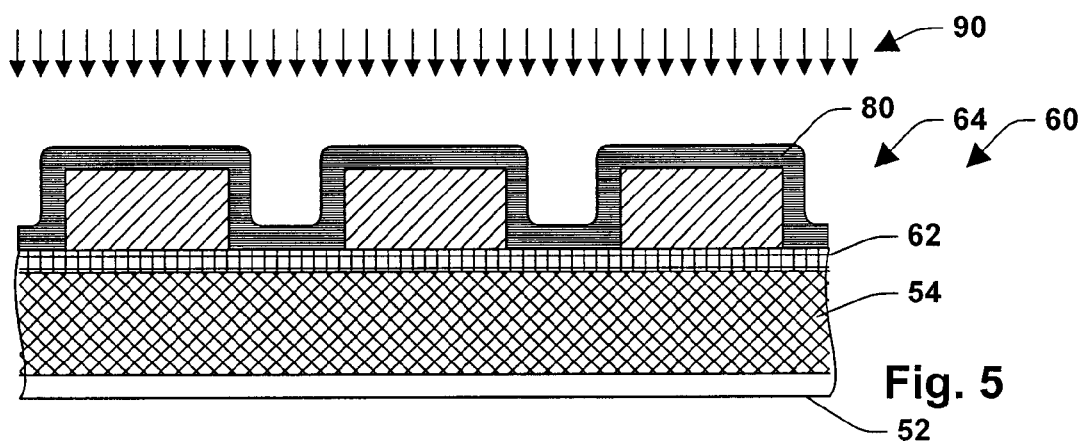
FIG. 5 is a schematic cross-sectional illustration of the structure of FIG. 4 undergoing a directional etch of the polymer layer in accordance with the present invention.

FIG. 5 illustrates a directional etch step 90 being performed to remove a predetermined thickness of the polymer layer 80. An etch chemistry including $CHF_3$, $O_2$, Ar and $CF_4$, for example, is employed to perform a dry directional etch of the polymer layer 80. Preferably, the directional etch 90 is performed to remove an amount of the polymer layer 80 equivalent to the conformal thickness of the polymer layer 80. The directional dry etch 90 is next adjusted to be selective to the ARC layer 62 so as to etch exposed portions of the ARC layer 62.

Figure 6:
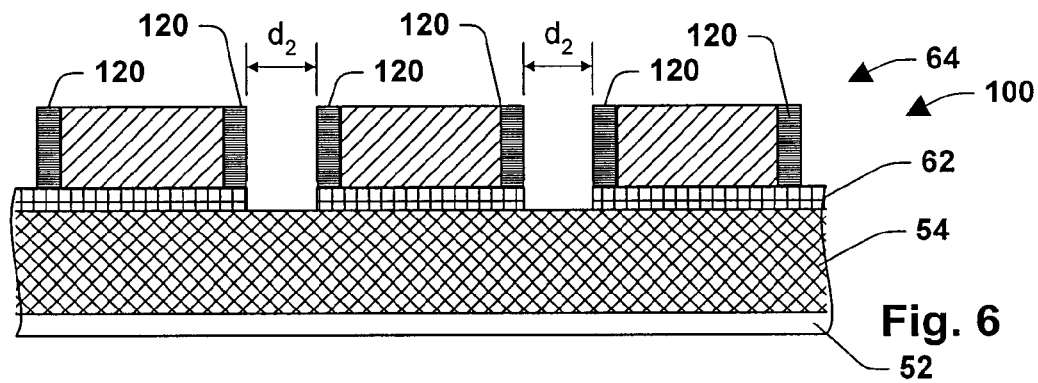
FIG. 6 is a schematic cross-sectional illustration of the structure of FIG. 5 after the directional etch is complete in accordance with the present invention.

Substantial completion of the etch step 90 results in a structure 100 shown in FIG. 6. The structure 100 includes polymer sidewalls 120 which result in exposed portions of the polysilicon layer 54 having a dimension of $d_2$. The dimension $d_2$ is less than the dimension $d_1$ (FIG. 1). The dimension $d_2$ may be controlled via the controlling the thickness ($\gamma$) of the polymer layer 80. For example, the dimension $d_2$ may be controlled according to the following relationship:

$$d_2 = d_1 - 2\gamma$$

Since there are two polymer sidewalls 120 within a particular dimension $d_1$ the value of $d_2$ equals $d_1$ less twice the polymer layer thickness ($\gamma$).

Figure 7:
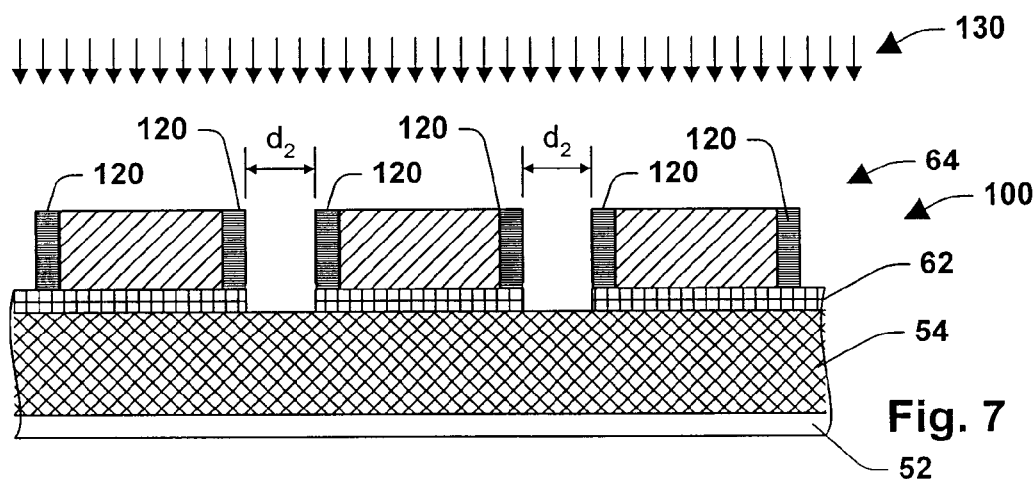
FIG. 7 is a schematic cross-sectional illustration of the structure of FIG. 6 undergoing an etch process to remove exposed portions of the anti-reflective layer and polysilicon layer in accordance with the present invention.

Next, referring to FIG. 7, a poly etch 130 is performed to etch exposed portions of the polysilicon layer 54 so as to form the lines 50 (FIG. 1) having a spacing there between, respectively, of $d_2$. The poly etch 130 chemistry may include, for example: (1) HBr, $Cl_2$ and He—$O_2$; or (2) $Cl_2$ and He—$O_2$; or (3) HBr and He—$O_2$. The etch chemistry may be suitably tailored in accordance with the thickness of the oxide layer 52, desired etch speed, and desired selectivity.

Figure 8:
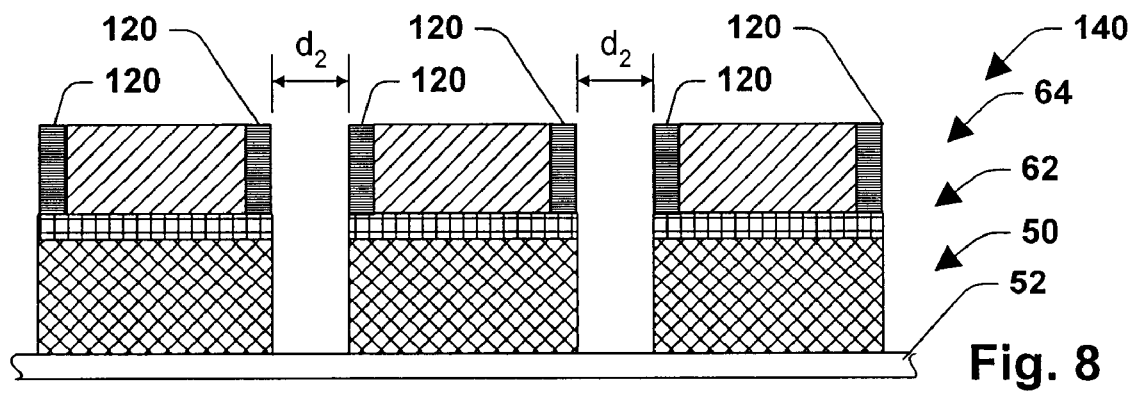
FIG. 8 is a schematic cross-sectional illustration of the structure of FIG. 7 after the etch process is complete in accordance with the present invention.

FIG. 8 illustrates a structure 140 resulting after the poly etch 130 is substantially complete. The structure 140 includes lines 50 having a spacing dimension between adjacent lines, respectively, equal to $d_2$.

Figure 9:
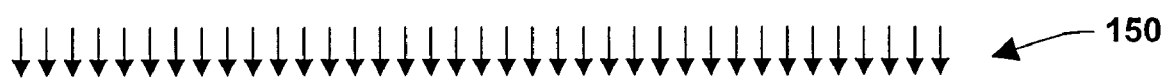
FIG. 9 is a schematic cross-sectional illustration of the structure of FIG. 8 undergoing a stripping process to remove remaining polymer and photoresist portions from the structure in accordance with the present invention.
Figure 9:
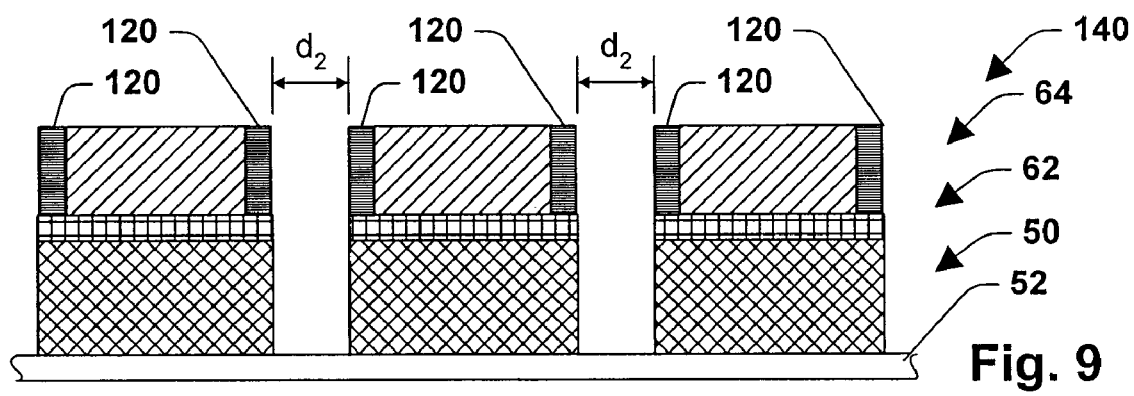

FIG. 9 illustrates an etch step 150 which removes remaining portions of the photoresist 64, remaining portions of the ARC layer 62 and the polymer sidewalls 120 from the structure 140.

Figure 10:
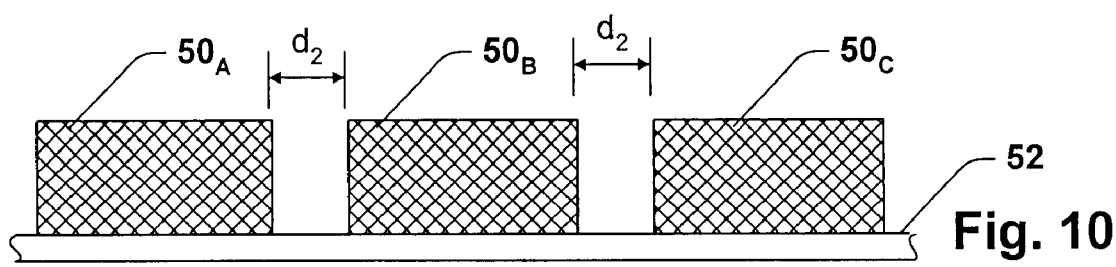
FIG. 10 is a schematic cross-sectional illustration of the structure of FIG. 9 after the stripping process is complete in accordance with the present invention.

FIG. 10 illustrates the lines 50 after the stripping step 150 is substantially complete. The spacing dimension between adjacent lines (e.g., $50_A$ and $50_B$) substantially equals $d_2$. Thus, for example, if a 0.18 $\mu$m tool set were employed to pattern the photoresist 64 with a spacing dimension $d_1$=0.20 $\mu$m and the polymer layer 80 was formed to have a thickness of 0.03 $\mu$m, the resulting spacing dimension between adjacent lines $50_A$ and $50_B$ would be approximately 0.14 $\mu$m= (0.20 $\mu$m−2(0.03 $\mu$m)). The minimum space dimension ($d_M$) for the 0.18 $\mu$m tool set employed is 0.18 $\mu$m, and such minimum space dimension typically would be difficult to achieve consistently in accordance with conventional techniques. However, by employing the present invention the same 0.18 $\mu$m tool set can be employed to achieve with substantial consistency minimum space dimensions between lines at and below the minimum space dimension parameter of the tool set.

Thus, the present invention provides for a method for employing a conventional tool set to obtain minimum space dimensions well below the minimum space parameter typically achievable by the tool set. As a result, the present invention provides for a relatively low cost alternative to purchasing new photolithographic tool sets for achieving reduced spacing between lines.

Figure 11:
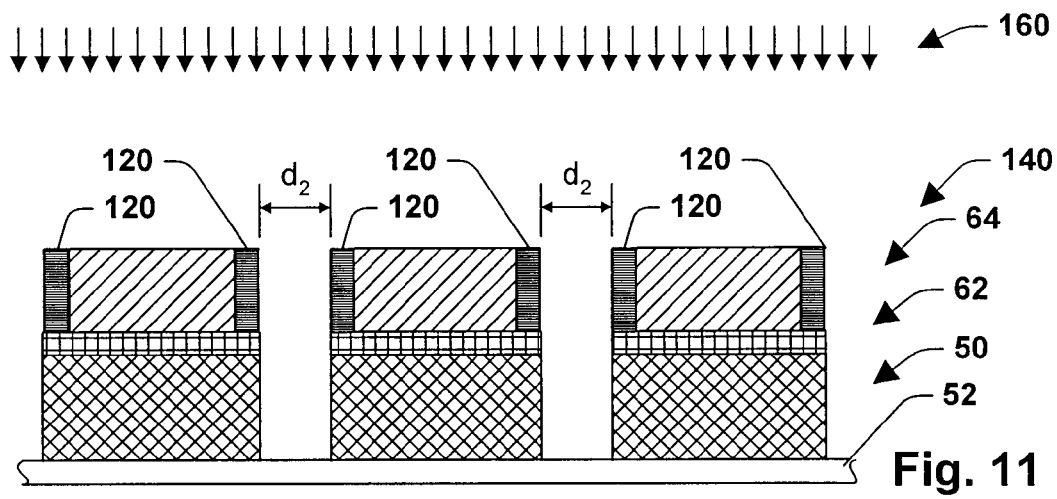
FIG. 11 is a schematic cross-sectional illustration of the structure of FIG. 8 undergoing an optional ion implant step.

FIG. 11 illustrates an optional ion implant step 160 (e.g., boron implant) which may be performed on the structure 140 of FIG. 8 so as to isolate active regions below the oxide layer 52. The patterned photoresist layer 64 and the polymer sidewalls 120 will serve as masks during the implant step 160.

FIGS. 12–23 illustrate another embodiment of the present invention.

Figure 12:
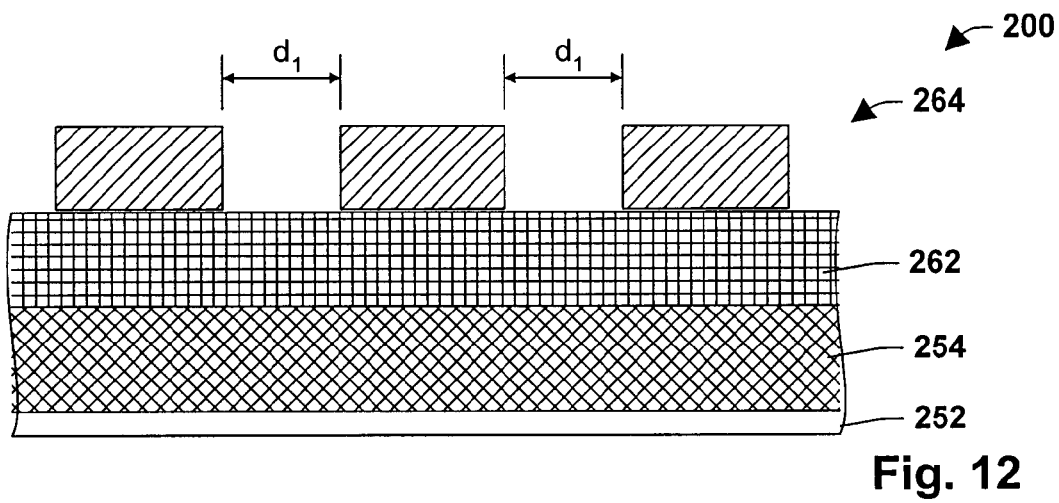
FIG. 12 is schematic cross-sectional illustration of a semiconductor structure including a polysilicon layer, an anti-reflective coating layer and a photoresist layer patterned with a tool set.

FIG. 12 illustrates a structure 200 which includes an oxide layer 252, a polysilicon layer 254, an anti-reflective coating layer 262 and a patterned photoresist layer 264.

Figure 13:
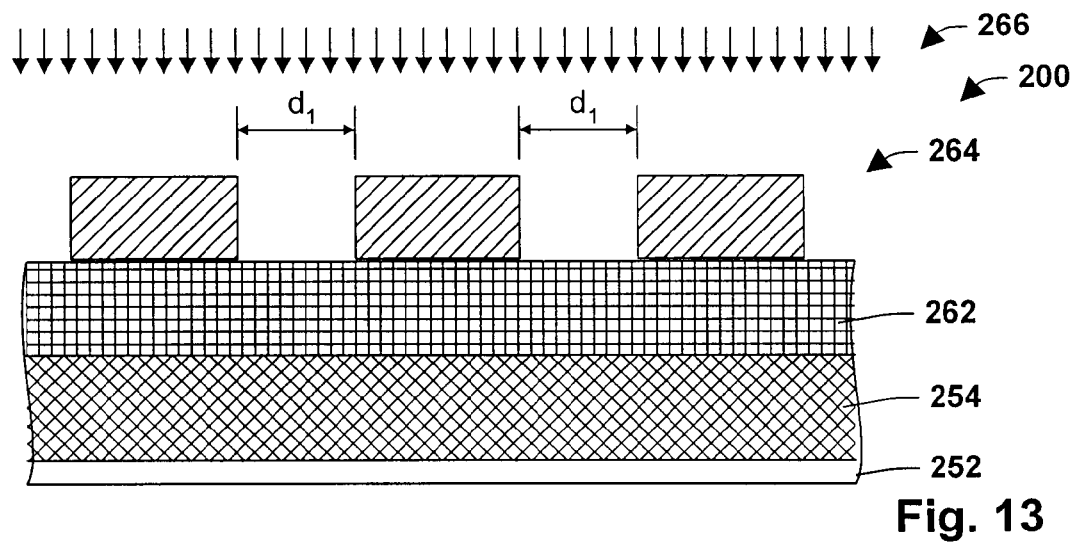
FIG. 13 is a schematic illustration of the semiconductor structure of FIG. 12 undergoing an etch step to etch a layer underlying the patterned photoresist layer in accordance with the present invention.

FIG. 13 illustrates an etch step 266 to etch exposed portions of the ARC layer 262.

Figure 14:
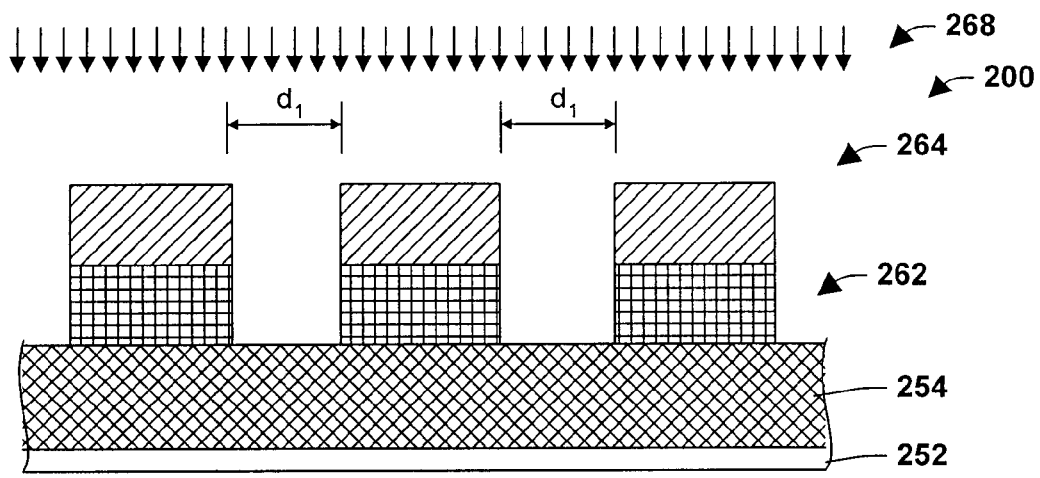
FIG. 14 is a schematic cross-sectional illustration of the structure of FIG. 13 after the underlayer etch step is complete, and illustrating the structure undergoing a photoresist stripping process in accordance with the present invention.

FIG. 14 illustrates a photoresist stripping step 268 to remove remaining portions of the photoresist layer 264.

Figure 15:
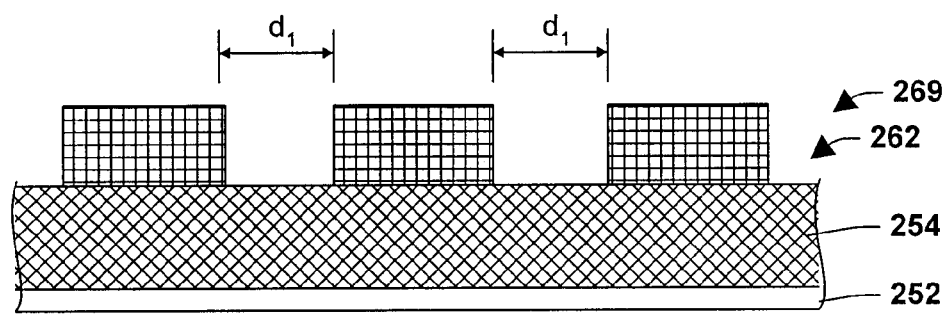
FIG. 15 is a schematic cross-sectional illustration of the structure of FIG. 14 after the photoresist has been removed in accordance with the present invention.

FIG. 15 illustrates a structure 269 formed after the etch step 266 and the stripping step 268 are substantially complete.

Figure 16:
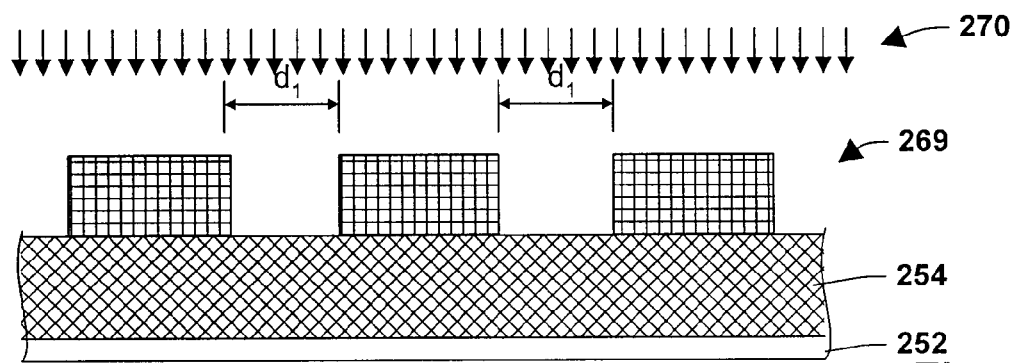
FIG. 16 is a schematic cross-sectional illustration of the structure of FIG. 15 undergoing a deposition process to conformably deposit a polymer layer on the structure in accordance with the present invention.
Figure 17:
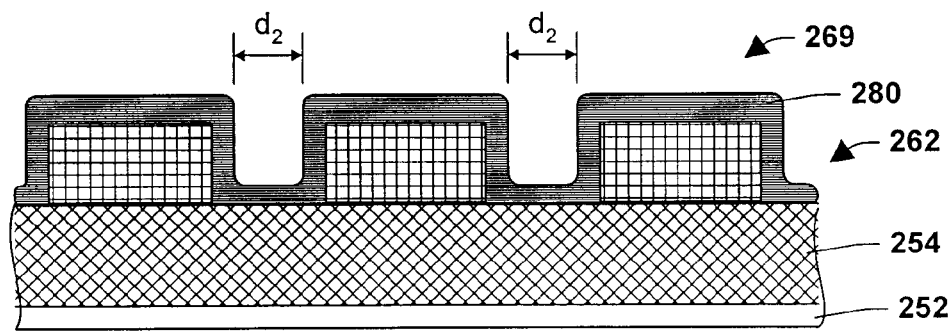
FIG. 17 is a schematic cross-sectional illustration of the structure of FIG. 16 after the polymer deposition step is substantially complete in accordance with the present invention.

FIG. 16 illustrates a polymer deposition step 270 performed on the structure 269 to form a carbon/oxygen based polymer conformal to the exposed surface of the structure 269. More particularly, the etched ARC layer 254 is exposed to a $CHF_3$ chemistry or an HBr chemistry or a $CH_3F$ or a $CH_2F_2$ chemistry to form a conformal polymer coating 280 (FIG. 17) on the ARC layer 262. Oxygen based reactive gases are reduced as compared to a typical etch chemistry so that the conformal polymer coating 280 is formed over the ARC layer 262.

Figure 18:
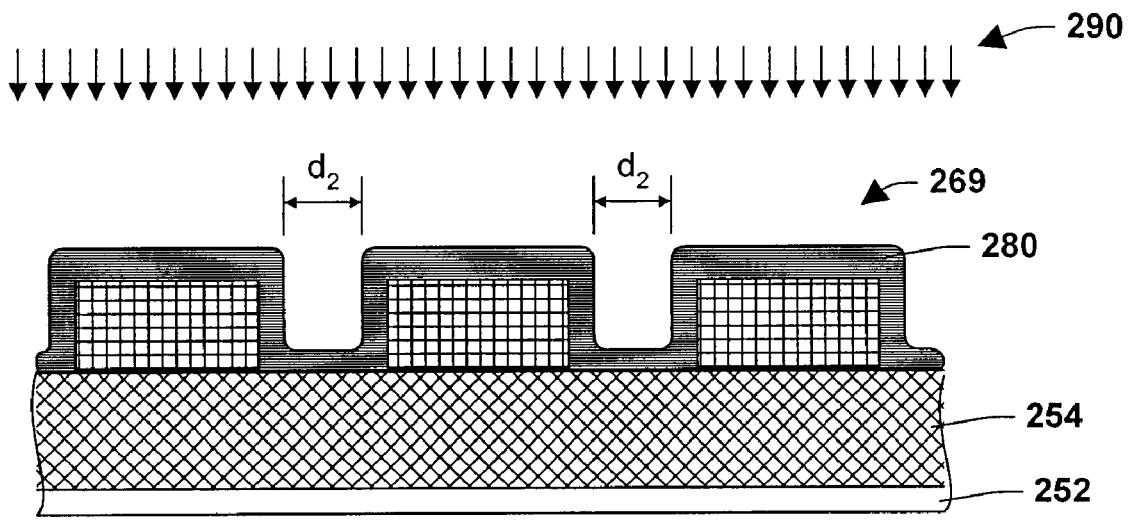
FIG. 18 is a schematic cross-sectional illustration of the structure of FIG. 17 undergoing a directional etch step in accordance with the present invention.

FIG. 18 illustrates a directional etch step 290 being performed to remove a predetermined thickness of the polymer layer 280. An etch chemistry including $CHF_3$, $O_2$, Ar and $CF_4$, for example, is employed to perform a dry directional etch of the polymer layer 280. Preferably, the directional etch 290 is performed to remove an amount of the polymer layer 280 equivalent to the conformal thickness of the polymer layer 280.

Figure 19:
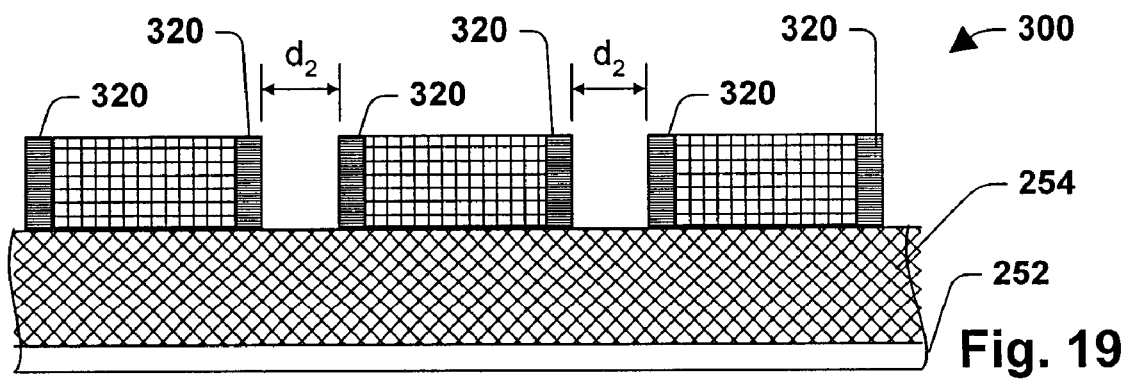
FIG. 19 is a schematic cross-sectional illustration of the structure of FIG. 18 after the directional etch step is substantially complete in accordance with the present invention.

Substantial completion of the etch step 290 results in a structure 300 shown in FIG. 19. The structure 300 includes polymer sidewalls 320 which result in exposed portions of the polysilicon layer 254 having a dimension of $d_2$. The dimension $d_2$ is less than the dimension $d_1$ (FIG. 12). The dimension $d_2$ may be controlled via the controlling the thickness ($\gamma$) of the polymer layer 280. For example, the dimension $d_2$ may be controlled according to the following relationship:

$$d_2 = d_1 - 2\gamma$$

Since there are two polymer sidewalls 320 within a particular dimension $d_1$, the value of $d_2$ equals $d_1$ less twice the polymer layer thickness ($\gamma$).

Figure 20:
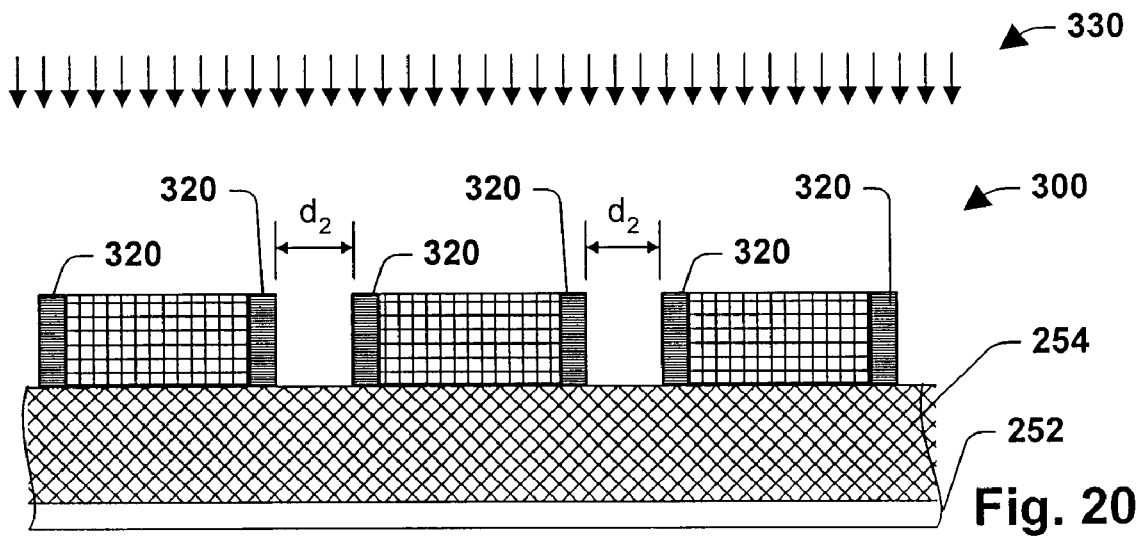
FIG. 20 is a schematic cross-sectional illustration of the structure of FIG. 19 undergoing a poly etch step to form lines in accordance with the present invention.
Figure 21:
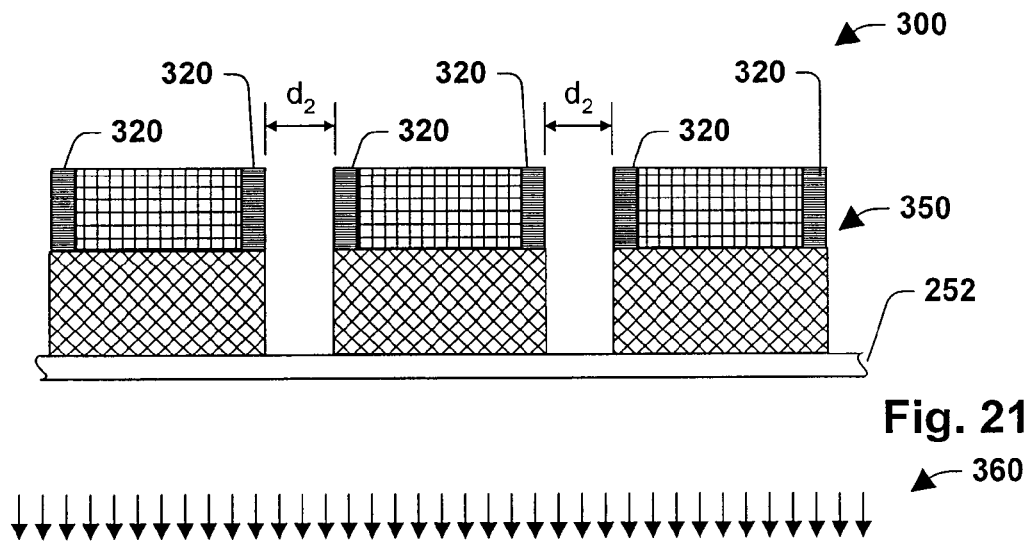
FIG. 21 is a schematic cross-sectional illustration of the structure of FIG. 20 after the poly etch step is substantially complete in accordance with the present invention.

Next, referring to FIG. 20, a poly etch 330 is performed to etch exposed portions of the polysilicon layer 254 so as to form lines 350 (FIG. 21) having a spacing there between, respectively, of $d_2$.

Figure 22:
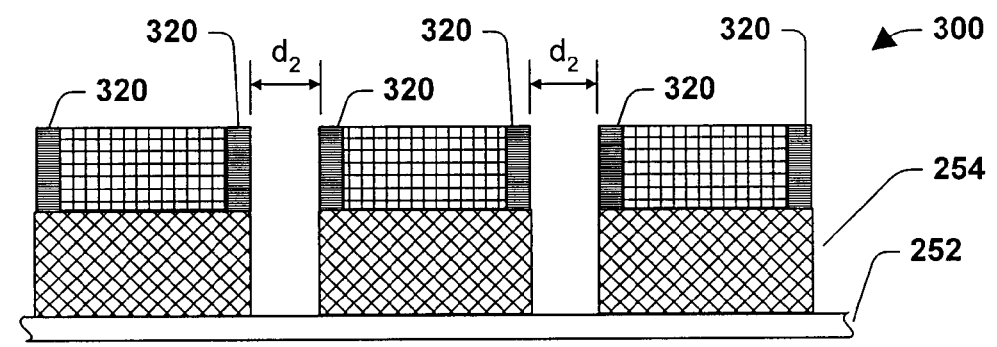
FIG. 22 is a schematic cross-sectional illustration of the structure of FIG. 21 undergoing a stripping process to remove remaining portions of the polymer layer and ARC layer in accordance with the present invention.

FIG. 22 illustrates a stripping step 360 to remove remaining portions of the ARC layer 262 and polymer sidewalls 330.

Figure 23:
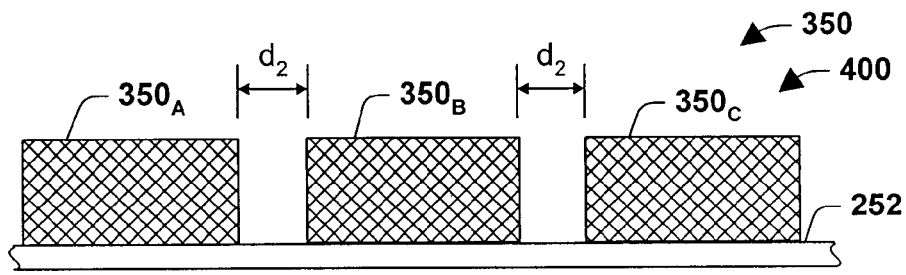
FIG. 23 is a schematic cross-sectional illustration of the structure of FIG. 22 substantially complete in relevant part in accordance with the present invention.

FIG. 23 illustrates a structure 400 including the lines 350 having a spacing dimension between adjacent lines (e.g., $350_A$ and $350_B$) substantially equal to $d_2$. The optional ion implant step 160 (e.g., boron implant) of FIG. 11 may also be employed in this embodiment on the structure of FIG. 21 so as to isolate active regions below the oxide layer 252.

Employing the present invention achieves with substantial consistency minimum space dimensions between lines at and below the minimum space dimension parameter of a particular tool set employed.

Figure 24:
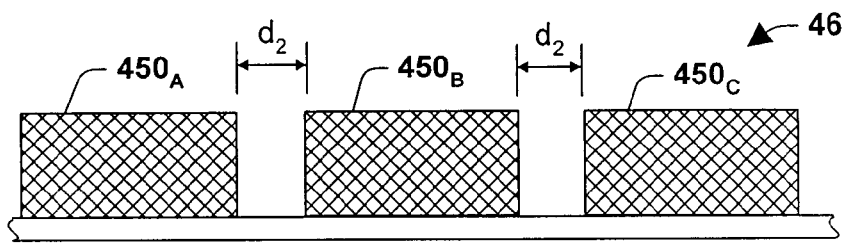
FIG. 24 is a schematic cross-sectional illustration of floating gates formed in accordance with the present invention.

Although the present invention has been described primarily in the context of forming lines, it is to be appreciated that the present invention may be applied to forming other features (e.g., floating gates of flash memory devices and/or embedded flash memory devices) where achieving small space dimension between adjacent features is desired. For example, as shown in FIG. 24 the principles of the present invention may be employed in the formation of closely spaces floating gates $450_A$, $450_B$ and $450_C$ of a memory device 460.

The present invention provides for a method for employing a particular photolithographic tool set to obtain minimum space dimensions well below the minimum space parameters typically obtainable by the tool set.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method for forming an etch mask, comprising the steps of:
    patterning a photoresist layer having a width dimension and a depth dimension, wherein $d_1$ is a smallest space dimension of an exposed area of a layer underlying the photoresist layer;
    forming a polymer layer to be conformal to the patterned photoresist layer and exposed portions of the underlayer; and
    etching the polymer layer from the width dimension of the patterned photo resist layer to form polymer sidewalls adjacent to the depth dimension of the patterned photo resist layer, the polymer sidewalls reducing the smallest space dimension of the exposed underlayer area to $d_2$, wherein $d_2 < d_1$.

2. The method of claim 1 further including the step of forming the polymer layer to have a minimum thickness of $\gamma$.

3. The method of claim 1 further including the step of using $CHF_3$ in forming the polymer layer.

4. The method of claim 1, further including the step of using HBr in forming the polymer layer.

5. The method of claim 1, further including the step of using $CH_3F$ in forming the polymer layer.

6. The method of claim 1, further including the step of using $CH_2F_2$ in forming the polymer layer.

7. The method of claim 1, further including the step of using a pressure within about the range of 50–100 mT in forming the polymer layer.

8. The method of claim 1, further including the step of using a power of less than or equal to about 500 W in forming the polymer layer.

9. The method of claim 1, further including the step of using a temperature below about 80° C. in forming the polymer layer.

10. The method of claim 1, further including forming the polymer layer to have a thickness ($\gamma$) with the range of about 10–1000 Å.

11. The method of claim 1, further including the step of using a dry directional etch to etch the polymer layer.

12. The method of claim 11, further including the step of using $CHF_3$, $O_2$, Ar and $CF_4$ in the dry directional etch step.

13. The method of claim 11, further including the step of predetermining the dimension $d_2$ according to the relationship $d_2=d_1-2\gamma$, wherein $\gamma$ is a thickness of the polymer layer.

14. A method for producing a small space pattern in a semiconductor layer, comprising the steps of:
   patterning a photoresist layer having a width dimension and a depth dimension of a semiconductor structure with a photolithographic tool set, a minimum printed space dimension of the patterned photoresist being $d_1$, wherein $d_1$ is the smallest space dimension consistently printable by the photolithographic tool set;
   forming a polymer layer to be conformal to the patterned photoresist layer and exposed portions of a first layer underlying the photoresist layer, $d_1$ being the smallest dimension of the exposed portions; and
   etching the polymer layer from the width dimension of the patterned photo resist layer an amount substantially equivalent to a minimum thickness parameter ($\gamma$) of the polymer to leave polymer sidewalls adjacent to the depth dimension of the patterned photo resist layer such that the smallest dimension of the exposed portions is now $d_2$, wherein $d_2<d_1$.

15. The method of claim 14 further including at least one of the following steps:
   etching the first layer underlying the photoresist layer such that a smallest dimension of exposed portions of the first layer is substantially equal to $d_2$; and
   etching a second layer underlying the first layer such that a smallest dimension of exposed portions of the second layer is substantially equal to $d_2$.

16. The method of claim 14 further including the step of using at least one of: $CHF_3$; HBr; $CH_3F$; and $CH_2F_2$ in forming the polymer layer.

17. The method of claim 14, further including the step of using a pressure within about the range of 50–100 mT in forming the polymer layer.

18. The method of claim 14, further including the step of using a power of less than or equal to about 500 W in forming the polymer layer.

19. The method of claim 14, further including the step of using a temperature below about 80° C. in forming the polymer layer.

20. The method of claim 14, further including forming the polymer layer to have a thickness ($\gamma$) with the range of about 10–1000 Å.

21. The method of claim 14, further including the step of using a dry directional etch to etch the polymer layer.

22. The method of claim 21, further including the step of using $CHF_3$, $O_2$, Ar and $CF_4$ in the dry directional etch step.

23. The method of claim 21, further including the step of predetermining the dimension $d_2$ according to the relationship $d_2=d_1-2\gamma$.

24. A method of forming closely spaced lines from a polysilicon layer, comprising the steps of:
   using a semiconductor structure including: the polysilicon layer; an anti-reflective coating (ARC) layer over the polysilicon layer; and a patterned photoresist layer having a width dimension and associated sidewalls over the ARC layer, wherein a smallest dimension of at least one exposed portion of the ARC layer equals $d_1$;
   forming a polymer layer to conform to an exposed surface of the semiconductor structure; and
   etching the polymer layer from the width dimension of the patterned photo resist layer so as to leave polymer portions along the sidewalls of the photoresist layer, the polymer portions reducing the smallest dimension of the at least one exposed portion of the ARC layer to $d_2$, wherein $d_2<d_1$.

25. The method of claim 24, further including the step of forming the polymer layer to have a thickness ($\gamma$).

26. The method of claim 25, further including the step of predetermining the dimension $d_2$ according to the relationship $d_2=d_1-2\gamma$.

27. The method of claim 24 further including the step of using at least one of: $CHF_3$; HBr; $CH_3F$; and $CH_2F_2$ in forming the polymer layer.

28. The method of claim 24 wherein the features are lines and a ratio of a line width to a space width is between the range of about 20:1 to 1:1.

29. The method of claim 24 wherein the features are lines and a ratio of a line width to a space width is between the range of about 20:1 to 10:1.

30. The method of claim 24, wherein the features are floating gates.

31. A method of forming closely lines from a polysilicon layer, comprising the steps of:
   patterning a photoresist layer of a semiconductor structure wherein $d_1$ is a smallest space dimension printed on the photoresist layer; the semiconductor structure including: the polysilicon layer; an anti-reflective coating (ARC) layer over the polysilicon layer; and the patterned photoresist layer over the ARC layer, wherein a smallest dimension of at least one exposed portion of the ARC layer substantially equals $d_1$;
   etching the ARC layer forming a width portion and a depth portion in the ARC layer;
   removing the photoresist layer;
   forming a polymer layer to conform to the width and depth portions of the ARC layer and exposed portions of a polysilicon layer underlying the ARC layer; and
   etching the polymer layer from the width portion of the ARC layer so as to leave polymer sidewalls adjacent to the depth portion of the ARC layer, the polymer sidewalls reducing the smallest dimension of the at least one exposed portion of the polysilicon layer to $d_2$, wherein $d_2<d_1$; and
   etching the polysilicon layer, wherein a smallest space dimension between at least two adjacent lines is substantially equal to $d_2$.

32. The method of claim 31, further including the step of predetermining the dimension $d_2$ according to the relationship $d_2=d_1-2\gamma$, wherein $\gamma$ is a thickness dimension of the polymer layer.

33. The method of claim 31, further including the step of using at least one of: $CHF_3$; HBr; $CH_3F$; and $CH_2F_2$ in forming the polymer layer.

* * * * *